US00RE48028E

(19) United States
(12) Reissued Patent
Semerad et al.

(10) Patent Number: US RE48,028 E
(45) Date of Reissued Patent: *Jun. 2, 2020

(54) LASER POWER AND ENERGY SENSOR UTILIZING ANISOTROPIC THERMOELECTRIC MATERIAL

(71) Applicant: Coherent, Inc., Santa Clara, CA (US)

(72) Inventors: Robert Semerad, St. Wolfgang (DE); Erik Krous, Wilsonville, OR (US); James Schloss, Tigard, OR (US)

(73) Assignee: Coherent, Inc., Santa Clara, CA (US)

( * ) Notice: This patent is subject to a terminal disclaimer.

(21) Appl. No.: 15/147,816

(22) Filed: May 5, 2016

Related U.S. Patent Documents

Reissue of:
(64) Patent No.: 9,012,848
Issued: Apr. 21, 2015
Appl. No.: 13/944,830
Filed: Jul. 17, 2013

U.S. Applications:
(60) Provisional application No. 61/709,060, filed on Oct. 2, 2012.

(51) Int. Cl.
*G01J 5/00* (2006.01)
*G01K 17/00* (2006.01)
(Continued)

(52) U.S. Cl.
CPC ..... *G01K 17/003* (2013.01); *G01J 1/4257* (2013.01); *G01J 5/046* (2013.01); *G01J 5/12* (2013.01); *H01L 31/0368* (2013.01)

(58) Field of Classification Search
CPC .... H01L 31/0368; H01L 31/0392; G01J 5/12; G01J 5/046; G01J 1/4257; G01K 17/003
(Continued)

(56) References Cited

U.S. PATENT DOCUMENTS 3,596,514 A 8/1971 Mefferd et al.
3,851,174 A * 11/1974 Tynan ..... H01L 37/00 250/336.1
(Continued)

FOREIGN PATENT DOCUMENTS

CN 101246055 A 8/2008
CN 102047085 A 5/2011
(Continued)

OTHER PUBLICATIONS

Office Action received for Japanese Patent Appiicatien No. 2015-534776, dated May 23, 2017, 11 Pages. (7 pages of English Translation and 4 pages).
(Continued)

*Primary Examiner* — Albert J Gagliardi
(74) *Attorney, Agent, or Firm* — Morrison & Foerster LLP

(57) ABSTRACT

A laser-radiation sensor includes a copper substrate on which is grown an oriented polycrystalline buffer layer surmounted by an oriented polycrystalline sensor-element of an anisotropic transverse thermoelectric material. An absorber layer, thermally connected to the sensor-element, is heated by laser-radiation to be measured and communicates the heat to the sensor-element, causing a thermal gradient across the sensor-element. Spaced-apart electrodes in electrical contact with the sensor-element sense a voltage corresponding to the thermal gradient as a measure of the incident laser-radiation power.

29 Claims, 6 Drawing Sheets

(51) Int. Cl.

| | |
|---|---|
| ***G01J 1/42*** | (2006.01) |
| ***H01L 31/0368*** | (2006.01) |
| ***G01J 5/12*** | (2006.01) |
| ***G01J 5/04*** | (2006.01) |

(58) Field of Classification Search
USPC ..... 250/338.3; 257/467
See application file for complete search history.

(56) References Cited

U.S. PATENT DOCUMENTS

| | | | | |
|---|---|---|---|---|
| 4,082,413 | A | 4/1978 | Austin et al. | |
| 5,607,899 | A | 3/1997 | Yoshida et al. | |
| 5,678,924 | A | 10/1997 | Naquin et al. | |
| 5,793,092 | A | 8/1998 | Habermeier et al. | |
| 5,823,682 | A | 10/1998 | Betz | G01J 5/12 374/130 |
| 6,265,353 | B1 | 7/2001 | Kinder et al. | |
| 6,361,598 | B1 | 3/2002 | Balachandran et al. | |
| 6,579,360 | B2 | 6/2003 | Balachandran et al. | |
| 6,638,598 | B2 | 10/2003 | Kinder et al. | |
| 8,026,486 | B2 | 9/2011 | Takahashi et al. | |
| 8,049,154 | B2 | 11/2011 | Takahashi et al. | |
| 8,129,689 | B2 | 3/2012 | Takahashi et al. | G01J 5/12 250/370.01 |
| 8,203,122 | B1 * | 6/2012 | Takahashi | G01J 5/12 250/370.01 |
| 8,716,187 | B2 * | 5/2014 | Moeckly | C04B 35/4508 505/100 |
| 2002/0139784 | A1 | 10/2002 | Tsuchiya et al. | |
| 2003/0127674 | A1 * | 7/2003 | Ramesh | 257/295 |
| 2008/0173343 | A1 | 7/2008 | Kanno et al. | |
| 2010/0327165 | A1 * | 12/2010 | Takahashi et al. | 250/338.1 |
| 2011/0230356 | A1 * | 9/2011 | Moeckly et al. | 505/238 |
| 2011/0291012 | A1 | 12/2011 | Takahashi et al. | |
| 2012/0161008 | A1 * | 6/2012 | Takahashi et al. | 250/340 |
| 2012/0196150 | A1 * | 8/2012 | Tsuchiya et al. | 428/701 |

FOREIGN PATENT DOCUMENTS

| | | | |
|---|---|---|---|
| DE | 4306497 | C2 | 1/1995 |
| DE | 19605384 | C1 | 1/1997 |
| DE | 19605384 | C1 | 2/1997 |
| DE | 19804487 | A1 | 8/1999 |
| JP | 8-247851 | A | 9/1996 |
| JP | 2000-506684 | A | 5/2000 |
| JP | 2002-289931 | A | 10/2002 |
| JP | 2011-243824 | A | 12/2011 |
| WO | 2005/083808 | A1 | 9/2005 |
| WO | 2008/056466 | A1 | 5/2008 |
| WO | 2010/058559 | A1 | 5/2010 |
| WO | 2011/148425 | A1 | 12/2011 |
| WO | 2014/055374 | A1 | 4/2014 |

OTHER PUBLICATIONS

Non-Final Office Action received for U.S. Appl. No. 13/944,830, dated Aug. 6, 2014, 8 pages.
Notice of Allowance received for U.S. Appl. No. 13/944,830, dated Dec. 23, 2014, 9 pages.
Non-Final Office Action received for U.S. Appl. No. 13/944,835, dated Jul. 31, 2014, 9 pages.
Notice of Allowance received for U.S. Appl. No. 13/944,835, dated Feb. 17, 2015, 8 pages.
Kusunoki et al., "The Influence of in-Plane 0-45° Grain Boundary on Microwave Surface Resistance of c-axis $YBa_2Cu_3O_y$ Films on MgO Substrate", Physica C: Superconductivity, vol. 321, 1999, pp. 81-85.
International Preliminary Report on Patentability received for PCT Patent Application No. PCT/US2013/062450, dated Apr. 16, 2015, 9 pages.
International Search Report and Written Opinion received for PCT Patent Application No. PCT/US2013/062450, dated Dec. 13, 2013, 13 pages.
International Preliminary Report on Patentability received for PCT Application No. PCT/US2014/018414, dated Jan. 28, 2016, 9 pages.
International Search Report and Written Opinion received for PCT Patent Application No. PCT/US2014/018414, dated May 26, 2014, 12 pages.
Pysarenko et al., "Development of Multilayer Coated Conductors with Simplified Buffer Structure", International Journal of Modern Physics B, vol. 23, No. 17, Jul. 10, 2009, pp. 3526-3531.
Wang et al., "Deposition of in-Plane Textured MgO on Amorphous $Si_3N_4$ Substrates by Ion-Beam-Assisted Deposition and Comparisons with Ion-Beam-Assisted Deposited Yttria-Stabilized-Zirconia", Applied Physics Letters, vol. 71, No. 20, 1997, p. 2955.
Zilbauer et al., "High Quality ISD MgO Buffers on Large Scale, Flexible Metal Substrates for RF Applications of HTS Thin Films", Superconductor Science and Technology, vol. 19, No. 11, Nov. 2006, pp. 1118-1123.
Office Action received for Japanese Patent Application No. 2016-527984, dated Aug. 16, 2017, 11 pages (7 pages of English Translation and 4 pages).
Office Action Received for Chinese Patent Application No. 201380051638.1, dated Mar. 3, 2017, 9 Pages (4 pages of English translation and 5 pages).
Notice of Allowance received for Chinese Patent Application No. 201380051638.1, dated Nov. 7, 2017, 3 pages (2 pages of English Translation and 1 page).
Notice of Allowance received for Japanese Patent Application No. 2015-534776, dated Jan. 16, 2018, 3 pages.
M. Kusunoki, "The influence of in-plane 0-458 grain boundary on microwave surface resistance of c-axis YBa Cu O films on MgO substrate." Physica C 321 _1999. 81-85.*
Balachandran et al., "Development of Coated Conductors by Inclined Substrate Deposition", Physica C, vol. 392-396, 2003, pp. 806-814.
Balachandran et al., "Development of YBCO-Coated Conductors for Electric Power Applications", Physica C, vol. 372-376, 2002, pp. 869-872.
Bauer et al., "Inclined Substrate Deposition by Evaporation of Magnesium Oxide for Coated Conductors", Material Research Society Symposium Proceedings, vol. 587, 1999, pp. O2.2.1-O2.2.10.
Chateigner et al., "Analysis of Preferred Orientations in Pst and Pzt Thin Films on Various Substrates", Integrated Ferroelectrics, vol. 19, 1998, pp. 121-140.
El-Naggar et al., "Characterization of Highly-Oriented Ferroelectric PbxBa1-x TiO3 Thin Films Grown by Metalorganic Chemical Vapor Deposition", Journal of Materials Research, vol. 20, No. 11, Nov. 2005, pp. 2969-2976.
Koritala et al., "Transmission Electron Microscopy Investigation of Texture Development in Magnesium Oxide Buffer Layers", IEEE Transactions on Applied Superconductivity, vol. 11, No. 1, Mar. 2001, pp. 3473-3476.
Ma et al., "High Critical Current Density of YBCO Coated Conductors Fabricated by Inclined Substrate Deposition", Physica C, vol. 403, 2004, pp. 183-190.
Ma et al., "Inclined-Substrate Deposition of Biaxially Textured Magnesium Oxide Thin Films for YBCO Coated Conductors", Physica C, vol. 366, 2002, pp. 270-276.
Pysarenko et al., "Development of Multilayer Coated Conductors with Simplified Buffer Structure", International Journal of Modern Physics B, vol. 23, No. 17, Jul. 2009, pp. 3526-3531.
Stan et al., "Structural and superconducting properties of (Y,Gd)Ba2Cu3O7-δ grown by MOCVD on samarium zirconate buffered IBAD-MgO", Superconductor Science and Technology, vol. 21, No. 10, Oct. 2008, pp. 1-4.
Zhang et al., "Thermoelectric Properties of C-Axis-Oriented Ca3Co4O9+δ Films Grown on MgO-Buffered Si (100) by PLD Technique", Applied Mechanics and Materials, vol. 29-32, 2010, pp. 1913-1918.
Zilbauer et al., "High Quality ISD MgO Buffers on Large Scale, Flexible Metal Substrates for RF Applications of HTS Thin Films", Superconductor Science and Technology, vol. 19, 2006, pp. 1118-1123.

(56) References Cited

OTHER PUBLICATIONS

International Search Report and Written Opinion received for PCT Patent Application No. PCT/US2014/018414, mailed on May 26, 2014, 12 pages.
International Search Report and Written Opinion received for PCT Patent Application No. PCT/US2013/062450, mailed on Dec. 13, 2013, 13 pages.
Lengfellner et al., "Thermoelectric Effect in Normal-State YBa2Cu3O7-δ Films", Europhysics Letters, vol. 25, No. 5, Feb. 10, 1994, pp. 375-378.
Takahashi et al., "Light-Induced Off-Diagonal Thermoelectric Effect Via Indirect Optical Heating of Incline-Oriented CaxCoO2 thin Film", Applied Physics Letters, vol. 100, 2012, pp. 181907-1-181907-4.

* cited by examiner

LASER POWER AND ENERGY SENSOR UTILIZING ANISOTROPIC THERMOELECTRIC MATERIAL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

PRIORITY CLAIM

This application claims priority of U.S. Provisional Application No. 61/709,060, filed Oct. 2, 2012, the complete disclosure of which is hereby incorporated herein by reference.

TECHNICAL FIELD OF THE INVENTION

The present invention relates in general to laser-radiation detectors. The invention relates in particular to a laser-radiation detector that utilizes a transverse thermoelectric effect.

DISCUSSION OF BACKGROUND ART

Laser-radiation detectors (sensors) are used in laser applications wherein laser-radiation power needs to be measured or monitored. The power measurement may be required from simple record-keeping or as part of some closed loop control arrangement. Commonly used radiation detectors are based on either photodiodes or thermopiles.

The photodiode-based sensors detect laser-radiation by converting photon energy of radiation to be measured into an electron-hole pairs in the photo-diode thereby generating a corresponding current, which is used a measure of laser-radiation power. Photodiodes sensors have a relatively fast temporal response, with rise times typically less than 1 microsecond (μs). A disadvantage of photodiode detectors is a limited spectral response. This spectral response is determined by the particular semiconductor materials used for forming the photodiode. By way of example, photodiode sensors based on silicon have a spectral acceptance bandwidth between about 0.2 micrometers (μm) and about 2.0 μm. A second limitation of a photodiode is relatively low optical power saturation. Photodiodes are typically limited to direct measurement of laser powers of less than 100 milliwatts (mW).

Thermopile sensors include a solid element which absorbs the radiation, thereby heating the element. One or more thermocouples in contact with the element create a current or voltage representative of the laser-radiation power incident on the element. Thermopile sensors have a slow response time relative to photodiode detectors. The response time is dependent on the size of the sensor-element. By way of example radial thermopiles with apertures of 19 millimeters (mm) and 200 mm have response times of approximately 1 second and 30 seconds respectively. Spectral response of the thermopile sensors depends on the absorption spectrum of the sensor. With a suitable choice and configuration of the sensor, the spectral response can extend from ultraviolet (UV) wavelengths to far infrared wavelengths. With a sufficient heat sink, thermopile sensors can measure lasers power up to about 10 kilowatts (kW).

One relatively new detector type which has been proposed to offer a temporal response comparable to a photodiode detector and a spectral response comparable with a thermopile detector is based on using a layer of an anisotropic transverse thermoelectric material as a detector element. Such an anisotropic layer is formed by growing the material in an oriented polycrystalline crystalline form, with crystals inclined non-orthogonally to the plane of the layer.

The anisotropic layer absorbs radiation to be measured thereby heating the layer. This creates a thermal gradient through the anisotropic material in a direction perpendicular to the layer. This thermal gradient, in turn, creates an electric field orthogonal to the thermal gradient. The electric field is proportional to the intensity of incident radiation absorbed. Such a detector may be referred to as a transverse thermoelectric effect detector. If the anisotropic layer is made sufficiently thin, for example only a few micrometers thick, the response time of the detector will be comparable with that of a photodiode detector. Spectral response is limited only by the absorbance of the anisotropic material. A disadvantage is that the transverse thermoelectric effect is relatively weak compared to the response of a photodiode.

One transverse-thermoelectric-effect detector is described in U.S. Pat. No. 8,129,689, granted to Takahashi et al. (hereinafter Takahashi). Takahashi attempts to offset the weakness of the transverse thermoelectric effect by providing first and second anisotropic material layers which are grown on opposite sides of a transparent crystalline substrate. In the Takahashi detector, radiation not absorbed by the first layer of anisotropic material is potentially absorbed by the second layer. It is proposed that a reflective coating can be added to the second layer to reflect any radiation not absorbed by the second layer to make a second pass through both layers.

Oriented polycrystalline layers can be deposited by a well-known inclined substrate deposition (ISD) process. This process is described in detail in U.S. Pat. No. 6,265,353 and in U.S. Pat. No. 6,638,598. Oriented polycrystalline layers have also been grown by a (somewhat less versatile) ion-beam assisted deposition (IBAD) process. One description of this process is provided in a paper "Deposition of in-plane textured MgO on amorphous $Si_3N_4$ substrates by ion-beam-assisted deposition and comparisons with ion-beam assisted deposited yttria-stabilized-zirconia" by C. P. Wang et.al, Applied Physics Letters, Vol 71, 20, pp 2955, 1997.

The above described Takahashi detector allows the anisotropic material layers to remain thin, while increasing the amount of light absorbed, but requires a transparent crystalline substrate polished on both sides, at costs potentially prohibitive for most commercial applications. Further, the Takashi detector arrangement isolates the crystalline substrate limiting the ability to heat-sink the substrate. This limits the power-handling capability of the detector to a maximum power of less than about 10 Watts (W), and may lead to a non-linear response.

SUMMARY OF THE INVENTION

In one aspect, a radiation detector sensor in accordance with the present invention comprises a substrate of a highly thermally conductive material. An oriented polycrystalline buffer-layer is deposited on a surface of the substrate. The buffer-layer has a crystal-orientation at a first angle between about 10 degrees and about 45 degrees. Formed on top of the buffer is an oriented polycrystalline sensor element of a thermoelectric material selected from the group of thermoelectric materials consisting of dysprosium barium cuprate, strontium sodium cobaltate, and strontium cobaltate is deposited on the buffer layer. The sensor-element has a crystalline c-axis orientation at a second angle between about 10-degrees and about 45-degrees relative to the normal to the surface of the substrate. A radiation-absorber layer is provided, the radiation-absorber absorber layer being in thermal communication with the sensor layer. First and second electrodes are spaced apart in electrical contact with the sensor-layer.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
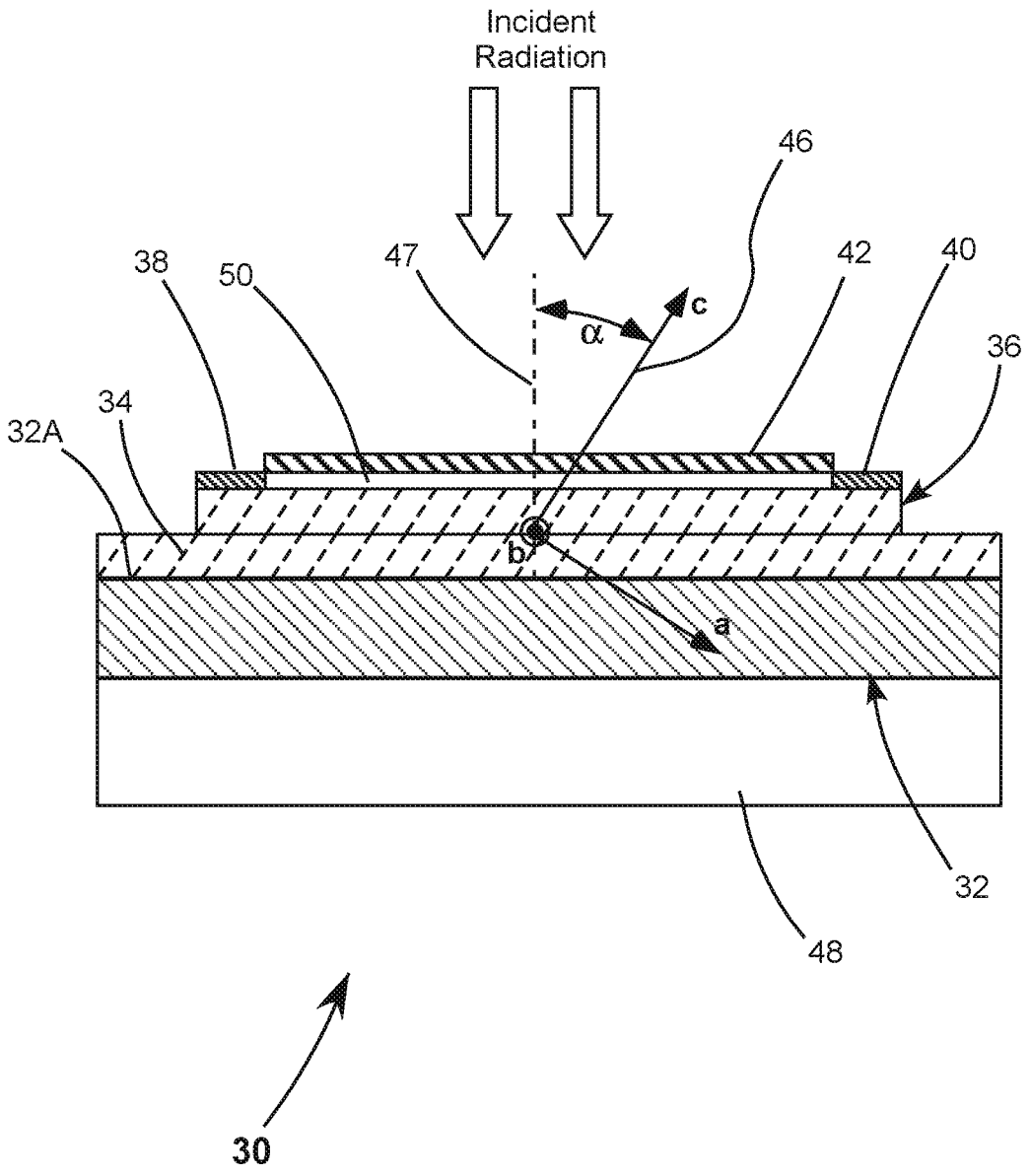
FIG. 1 is a cross-section view schematically illustrating a preferred embodiment of a transverse thermoelectric detector in accordance with the present invention, including a copper substrate, a buffer layer on the substrate a sensor layer on the buffer layer, a protective layer on the sensor layer, and absorber layer on the protective layer, with spaced apart electrodes in electrical contact with the sensor layer.

Referring now to the drawings, wherein like components are designated by like reference numerals, FIG. 1 schematically illustrates a preferred embodiment 30 of a transverse thermoelectric sensor in accordance with the present invention. Sensor 30 includes a substrate 32 of a highly thermally conductive material. A preferred material for substrate 32 is copper (Cu). Copper is a preferred material due to its high thermal conductivity and relatively low cost. Substrate 32 has a polished surface 32A, preferably having a RMS roughness less than about 0.5 μm. The substrate is optionally in contact with a heat-sink 48, which can be passively or actively cooled.

An oriented polycrystalline buffer-layer 34 is deposited on a surface 32A of the substrate. A preferred material for buffer layer 34 is magnesium oxide (MgO). Other suitable buffer layer materials include yttrium stabilized zirconia (YSZ), cerium oxide ($CeO_2$). Buffer layer 34 has a columnar grain structure with crystal-axis (the c-axis) 46 thereof tilted at an angle α in the direction by between about 10-degrees and about 45-degrees relative to a normal 47 to substrate surface 32A. In the drawing, the a-c plane of the crystal axes is in the plane of the drawing with the crystalline b-axis perpendicular to the plane of the drawing. A preferred thickness for the buffer layer is between about 0.5 μm and about 3.0 μm.

A layer 36 of sensor-material 36 is deposited on buffer layer 32. The inclined oriented crystal structure of the buffer layer causes the layer of sensor-material to grow in the inclined polycrystalline form necessary for providing the desired transient thermoelectric effect. The tilted crystalline structure is indicated I the drawing by long-dashed lines.

The use of the buffer eliminates a need for the substrate to be crystalline, allowing the use of the preferred copper substrate. The crystalline orientation of the sensor layer (c-axis orientation) is comparable to that of the buffer layer, i.e., between about 10 degrees and about 45 degrees but more probably between about 15-degrees and about 40-degrees. The inclination angles for the buffer and sensor layers can be about the same or somewhat different angles within the stated ranges.

The material of the sensor-layer is a material selected from the group of thermoelectric materials consisting of dysprosium barium cuprate ($DyBa_2Cu_3O_7$-d, often abbreviated to DyBCO), strontium sodium cobaltate ($Sr_{0.3}Na_{0.2}CoO_2$), and strontium cobaltate ($Sr_3Co_4O_9$). Dysprosium barium cuprate is most preferred. A preferred thickness for sensor layer 36 is between about 5 nanometers (nm) and about 500 nm. This thickness is less than that of the buffer layer and is required for creating a high thermal gradient across the sensor layer.

Optionally, a layer 50 is deposited for protecting the sensor layer from environmental degradation. Such a protection layer is critical when DyBCO is used for sensor layer 36. Preferred materials for the protection layer include MgO, and silicon dioxide ($SiO_2$). In the absence of a protective layer, the thermoelectric properties of DyBCO will degrade over a relatively quick time with exposure to ambient oxygen and elevated temperatures. Similarly, strontium cobaltate and strontium sodium cobaltate are degraded by exposure to atmospheric humidity. A preferred thickness for protective layer 50 is between about 0.2 μm and about 2.0 μm.

An optically black radiation-absorbing layer 42 is grown on protective layer 50. The absorption spectrum of this layer essentially determines the spectral response of the inventive transverse thermoelectric radiation sensor. Suitable materials for layer 42 include boron carbide, titanium nitride, chromium oxide, gold black, or carbon. The absorption layer preferably has a thickness between about 0.5 μm and about 5.0 μm. Whatever the selected material, layer 42 is preferably made sufficiently thick such that about 95% or greater of radiation is absorbed and converted to heat within the absorption layer. Incomplete absorption in layer 42 results in less than optimum thermoelectric response signal, and can result in a non-linear response.

When the radiation-absorber layer is heated by incident radiation a thermal gradient is formed across sensor layer 36 between the radiation-absorber layer and copper substrate 32. Because of a high anisotropy of the thermoelectric properties of sensor layer 36 resulting from the tilted crystal-axis, heat flow across the thickness of the sensor layer, generates an electric field in the sensor layer perpendicular (transverse to) to the heat-flow (thermal-gradient) direction. This transverse electric field results from significantly different values of Seebeck coefficients in the crystalline a-b and c directions for the sensor-layer material.

Elongated electrodes 38 and 40, parallel to each other and spaced apart, are deposited on sensor layer 36 in electrical contact therewith. Suitable materials for the electrodes include gold (Au), platinum (Pt), silver (Ag), and palladium (Pd). The transverse electric field between the electrodes results in a voltage between, the electrodes, linearly proportional to the incident radiation power on the absorbing layer. This voltage can be approximated by an equation:

$$V_x = \frac{L}{2t}\Delta T_z(S_{ab} - S_c)\sin(2\alpha) \quad (1)$$

where $V_x$ is the voltage produced between the first electrode 38 and the second electrode 40; t is the thickness of sensor-layer 36, $\Delta T_z$ is the temperature differential across sensor layer 36; $\alpha$ is the tilt angle of the crystalline c-axis of layer 36; $S_{ab}$ and $S_c$ are the Seebeck coefficients in respectively the a-b and c crystal directions of the sensor layer; and L is the diameter of the incident beam of laser radiation.

Figure 2:
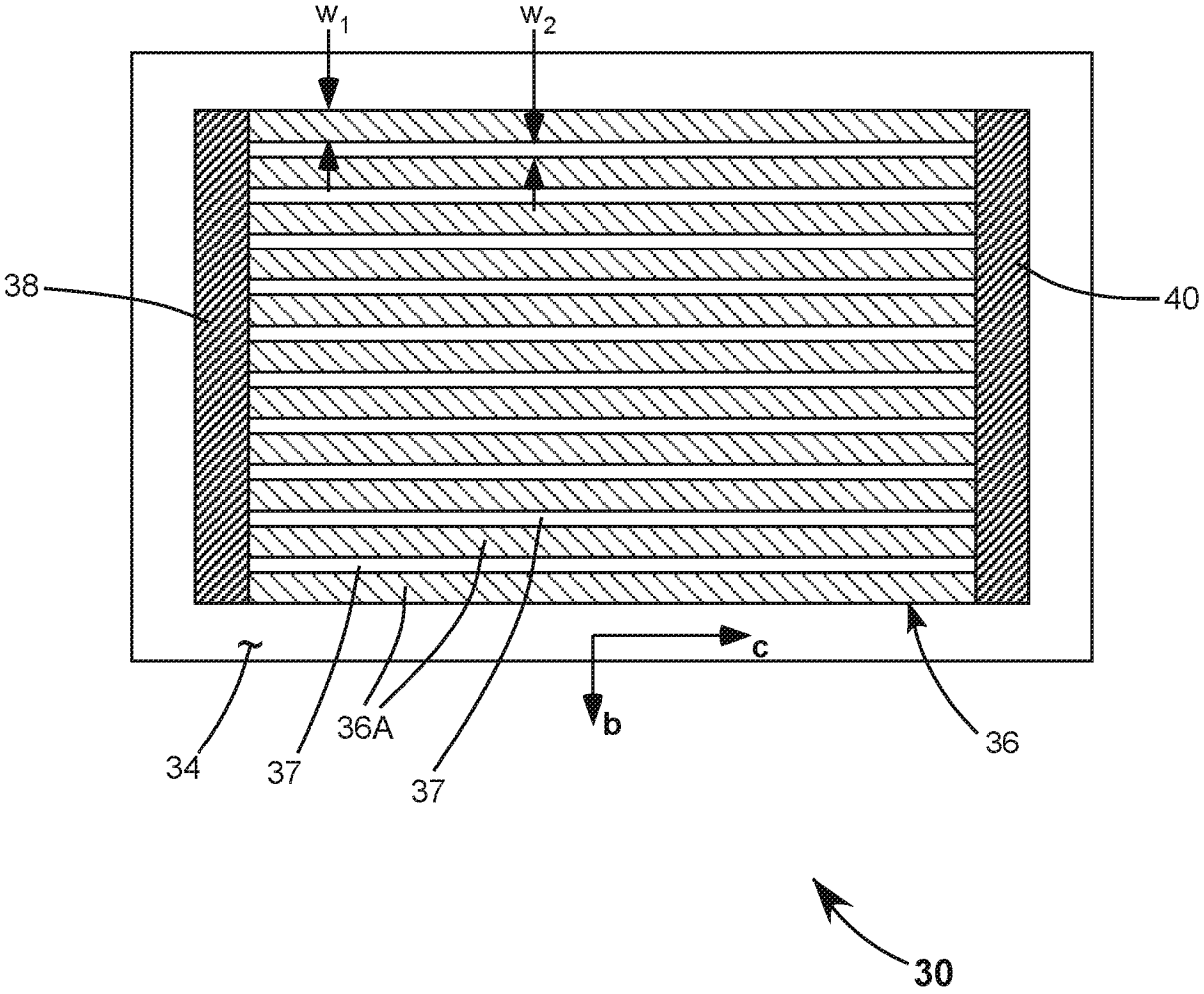
FIG. 2 is a plan-view from above schematically illustrating a preferred arrangement of electrodes and patterned sensor layer material for the detector of FIG. 1.

FIG. 2 is plan-view from above schematically a preferred arrangement of sensor layer 36 in which the sensor layer is patterned into a plurality of strips 36A, each thereof extending between electrodes 38 and 40. The width of the strips is designated as $W_1$ and the width of the gaps between the strips is designated $W_2$. Here, the strips are aligned parallel to the c-axis direction of the sensor layer. The strips can be formed by photolithography and wet-etching of a continuous layer of thermoelectric material. Layer 36 can be defined for purposes of this description and the appended claims as a sensor-element, which term applies to continuous sensor-layer and or a layer patterned into the parallel strips of FIG. 2 or some other pattern.

In one example of the inventive detector, strips (c-axis aligned) of DyBCO having a width $W_1$ of about 300 μm, with gaps $W_2$ of about 50 μm therebetween, with a length between electrodes of about 33 mm and a width of about 32 mm across the pattern of strips, provided a thermoelectric signal of about 100 microvolts (μV) when the detector was irradiated by carbon dioxide ($CO_2$) laser-radiation having a power of about 100 Watts (W). Without patterning, i.e., with sensor-element 36 as a continuous sheet between the electrodes, the thermoelectric signal voltage was about 35 μV.

In another example of the inventive detector, with dimensions as in the above example, but with strips 36A aligned at 45-degrees to the c-axis direction, the thermoelectric signal was about 60 μV. In yet another example, with 45-degree aligned strips, but with $W_1$ and $W_2$ each about 100 μm, the thermoelectric signal was about 61 μV. These exemplary results indicate that, for a given active area of the detector, the thermoelectric signal is dependent on the alignment of sensor-material strips with the crystalline c-axis of the thermoelectric material, but may not be sensitive to the width of the strips and gaps therebetween. Indeed, strip-width to gap ratios from 1 to 6 were tested with no significant change observed in thermoelectric response.

Figure 3:
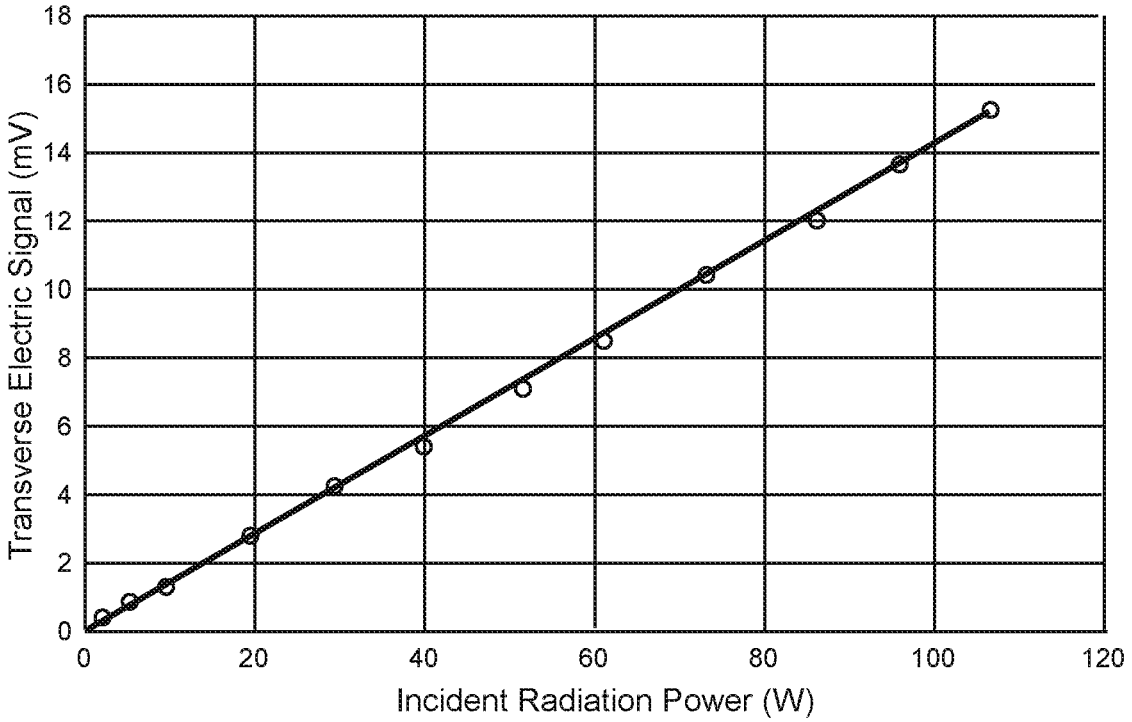
FIG. 3 is a graph schematically illustrating measured transverse thermoelectric signal as a function of incident CW laser-radiation power for an example of the detector of FIG. 2 wherein the sensor layer is a layer of dysprosium barium cuprate.

FIG. 3 is a graph schematically illustrating thermoelectric signal voltage as a function of incident CW $CO_2$ laser power for an example of the inventive detector having a DyBCO sensor-element patterned as depicted in FIG. 2. Again, the active area is 33 mm×32 mm. It can be seen by comparing individual data points (circles) with the best-fit straight line that the sensor response is very linear.

Figure 4:
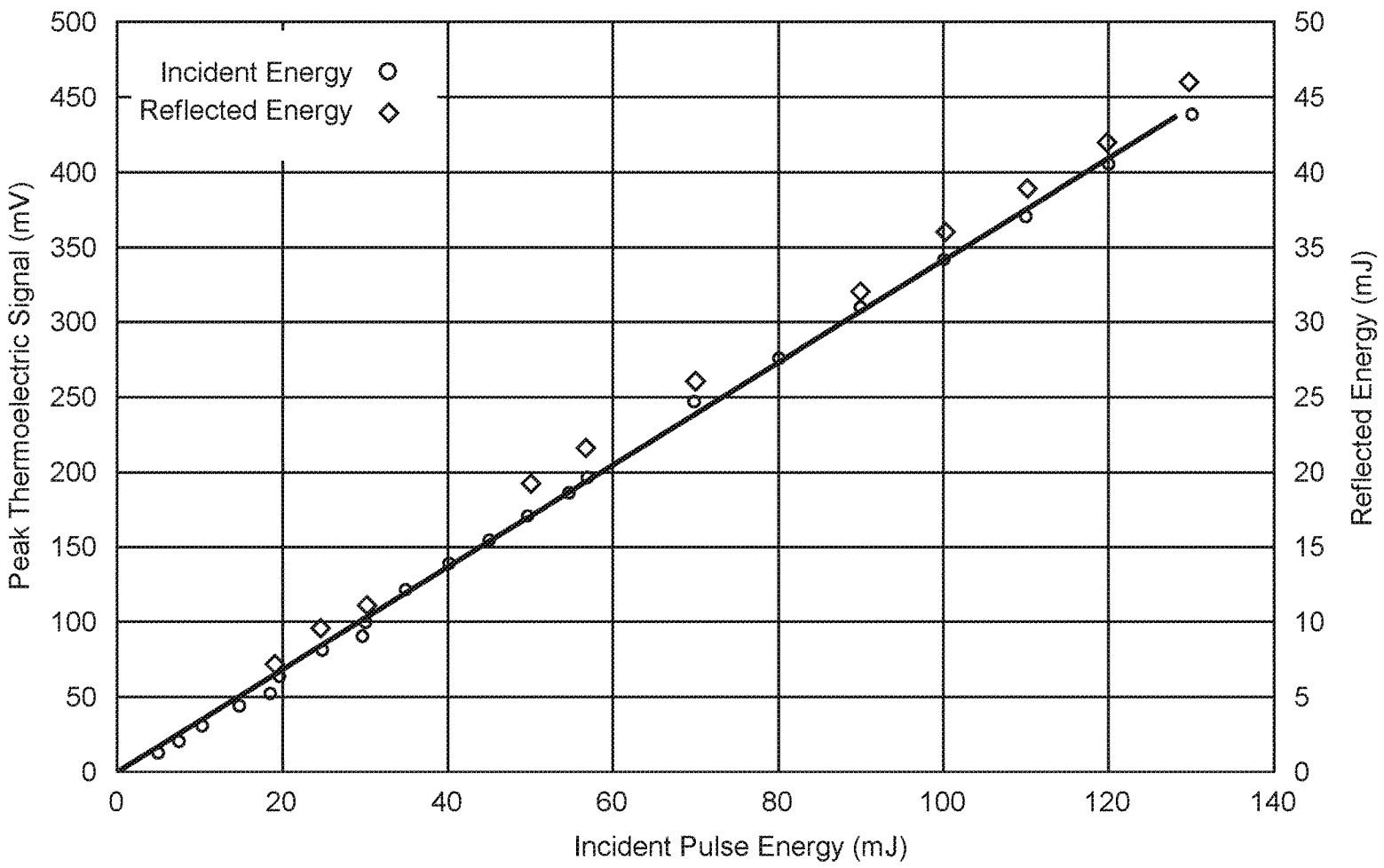
FIG. 4 is a graph schematically illustrating measured peak thermoelectric voltage and reflected energy as a function of incident 10-nanosecond pulsed-energy for the detector example of FIG. 3.

FIG. 4 is a graph schematically illustrating peak thermoelectric voltage (circles) and reflected energy (diamond) as a function of incident pulse-energy for the detector example of FIG. 3 responsive to incident 10 nanosecond (ns) pulses from a 1064-nm solid state laser. The solid straight line in the graph of FIG. 4 is a best-fit to the circle (peak-voltage) data-points, indicating the same high degree of linearity of response experienced with CW radiation as in the graph of FIG. 3.

Figure 5:
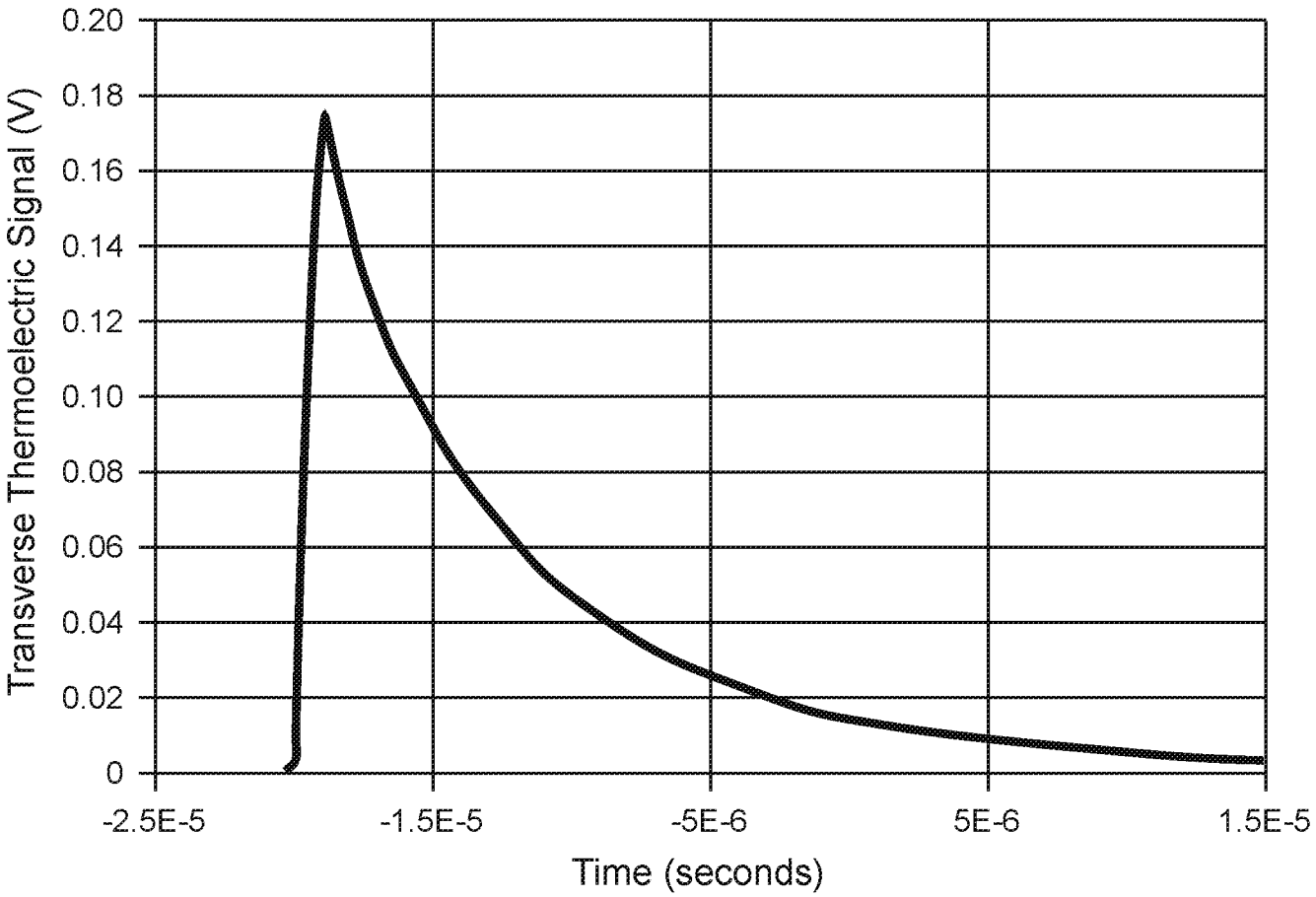
FIG. 5 is a graph schematically illustrating a transverse thermoelectric voltage signal as a function of time for the detector example of FIG. 4 in response to irradiation by single 10-nanosecond pulse.

FIG. 5 is a graph schematically illustrating thermoelectric signal as a function of time for one of the pulses of the graph of FIG. 4. The response-time (rise-time) of the signal is about 640 nanoseconds, which is comparable to the response of a photodiode detector.

Figure 6:
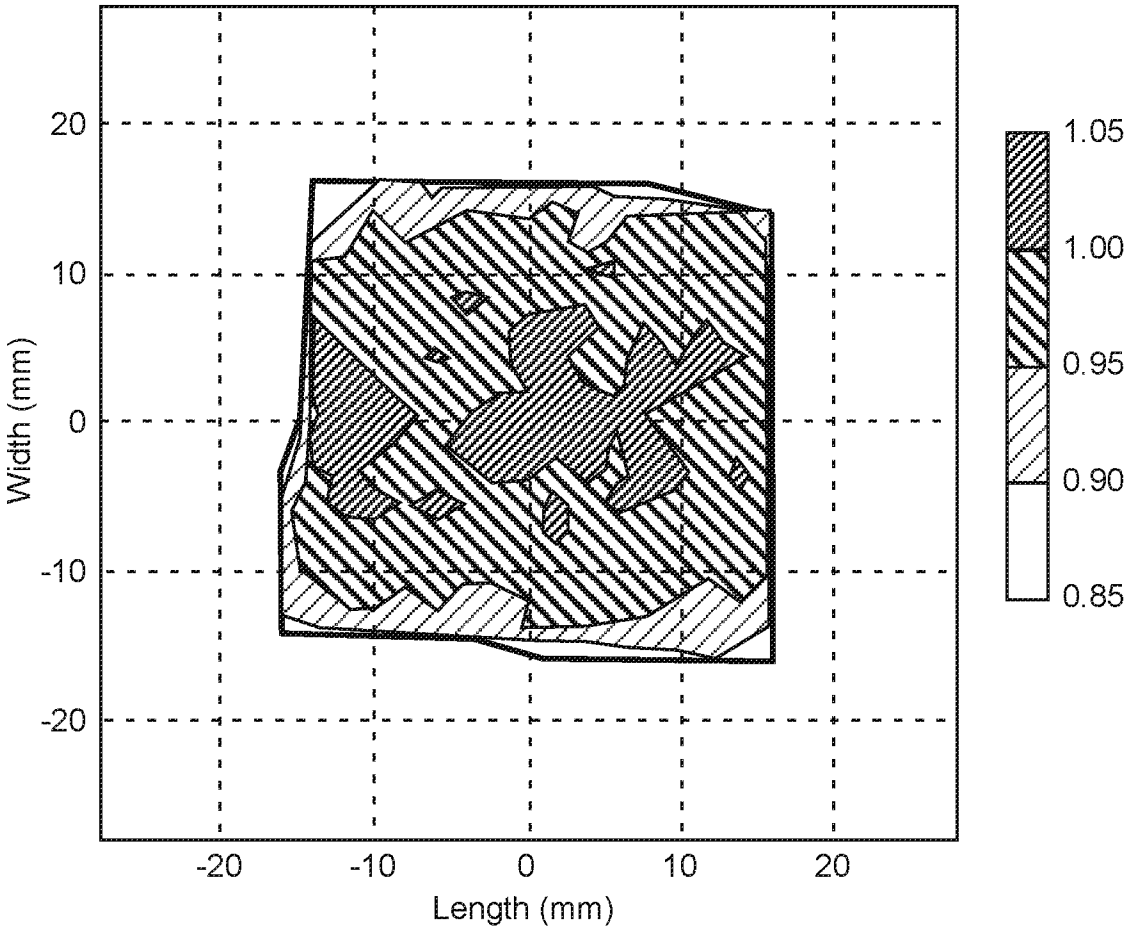
FIG. 6 is a contour plot schematically illustrating normalized spatial uniformity of efficiency in the detector example of FIG. 3.

The above-described patterning of sensor layer 36 not only improves sensitivity of the inventive detector but also the spatial uniformity of the sensitivity. Normalized spatial distribution of sensitivity of the detector of FIGS. 3 and 4 is schematically depicted in FIG. 6. It can be seen that the spatial uniformity over most of the useful area of the detector is about ±5%. The spatial uniformity for the same detector without a patterned sensor layer was about ±20% over the same region.

Regarding power-handling capability of the inventive detector, for any particular substrate and buffer layer, this will be determined by the selection of the sensor-layer material. By way of example, cuprates, such as dysprosium barium cuprate, have a maximum service temperature of ≤350° C. Based on heat Transfer calculations it is estimated that a detector using dysprosium barium cuprate as a sensor-material will be limited to measuring radiation power up to about 2 kilowatts (kW). Cobaltate transverse thermoelectric materials, such as strontium cobaltate, in principle have service temperatures ≥350° C. and should allow measurement of laser power greater than 2 kW.

In summary, the present invention is described in terms of a preferred and other embodiments. The invention is not limited, however, to the embodiments described and depicted herein. Rather the invention is limited only by the claims appended hereto.

What is claimed is:

1. A laser-radiation sensor, comprising:

a copper substrate;

an oriented polycrystalline buffer-layer deposited on a surface of the substrate, the buffer-layer having a crystal-orientation at a first angle between about 10 degrees and about 45 degrees relative to a normal to the surface of the substrate;

an oriented polycrystalline sensor-element of a thermoelectric material selected from the group of thermoelectric materials consisting of dysprosium barium cuprate, strontium sodium cobaltate, and strontium cobaltate deposited on the buffer layer, the sensor-element having a crystalline c-axis orientation at a second angle between about 10 degrees and about 45 degrees relative to the normal to the surface of the substrate;

a radiation-absorber layer in thermal communication with the sensor-element; and first and second elongated electrodes spaced apart in electrical contact with the sensor-element.

2. The laser-radiation sensor of claim 1, wherein the sensor-element is a continuous layer of the oriented polycrystalline sensor-material extending between the first and second electrodes.

3. The laser-radiation sensor of claim 1, wherein the sensor-element includes a plurality of strips of the oriented polycrystalline sensor-material spaced apart, parallel to each other, and extending between the first and second electrodes.

4. The laser-radiation sensor of claim 3, wherein the strips of the sensor-element are aligned parallel to the crystalline c-axis of the oriented polycrystalline sensor-material.

5. The laser-radiation sensor of claim 1, further including a protection layer between the sensor-element and the radiation-absorber layer.

6. The laser-radiation sensor of claim 5, wherein the protection layer is a layer of one of magnesium oxide, and silicon dioxide.

7. The laser-radiation sensor of claim 6, wherein the radiation-absorber layer is a layer of a radiation-absorbing material selected from a group of radiation-absorbing materials consisting of boron carbide, titanium nitride, chromium oxide, gold black, and carbon.

8. The laser-radiation sensor of claim 1, wherein the electrodes include a metal selected from a group of metals consisting of gold, platinum, silver, and palladium.

9. The laser- radiation sensor of claim 1, wherein the buffer layer is a layer of material selected from a group of materials consisting of magnesium oxide, yttrium stabilized zirconia, and cerium oxide.

10. The laser-radiation sensor of claim 1, wherein the first and second angles are about the same.

11. A laser-radiation sensor, comprising:

a *copper* substrate [of a highly thermally conductive material];

an oriented polycrystalline buffer-layer deposited on a surface of the substrate, the buffer-layer having a crystal-orientation at a first angle between about 10 degrees and about 45 degrees relative to a normal to the surface of the substrate;

an oriented polycrystalline sensor-element of a thermoelectric material selected from the group of thermoelectric materials consisting of dysprosium barium cuprate, strontium sodium cobaltate, and strontium cobaltate deposited on the buffer layer, the sensor-element having a crystalline c-axis orientation at a second angle between about 10 degrees and about 45 degrees relative to the normal to the surface of the substrate;

a protection layer deposited on the sensor-element;

a radiation-absorber layer deposited on the protection layer;

first and second elongated electrodes spaced apart in electrical contact with the sensor-element; and wherein the sensor-element includes a plurality of strips of the oriented polycrystalline sensor-material spaced apart, parallel to each other, and extending between the first and second electrodes, with each of the strips in electrical contact with the first and second electrodes.

[12. The laser-radiation sensor of claim 11, wherein the substrate is a copper substrate.]

13. The laser-radiation sensor of claim 11, wherein the buffer layer has a thickness between about 0.5 micrometers and about 3.0 micrometers, and is a layer of material selected from a group of materials consisting of magnesium oxide, yttrium stabilized zirconia, and cerium oxide.

14. The laser-radiation sensor of claim 11, wherein the strips of sensor material have a thickness between about 5 nanometers and about 500 nanometers.

15. The laser-radiation sensor of claim 11, wherein the protection layer has a thickness of between about 0.2 micrometers and about 2.0 micrometers, and is a layer of one of magnesium oxide, and silicon dioxide.

16. The laser-radiation sensor of claim [12] *11*, wherein the absorber layer has a thickness of between about 0.5 micrometers and about 5.0 micrometers, and is a layer of a radiation-absorbing material selected from a group of radiation-absorbing materials consisting of boron carbide, titanium nitride, chromium oxide, gold black, and carbon.

*17. A laser-radiation sensor, comprising:*

*a copper substrate;*

*an oriented polycrystalline buffer-layer deposited on the substrate, the buffer-layer having a crystal-orientation at a first angle between about 10 degrees and about 45 degrees relative to a normal to the surface of the substrate;*

*an oriented polycrystalline sensor-element of a thermoelectric material selected from the group of thermoelectric materials consisting of dysprosium barium cuprate, strontium sodium cobaltate, and strontium cobaltate deposited on the buffer layer, the sensor-element having a crystalline c-axis orientation at a second angle between about 10 degrees and about 45 degrees relative to the normal to the surface of the substrate;*

*a radiation-absorber layer in thermal communication with the sensor-element; and*

*first and second elongated electrodes spaced apart in electrical contact with the sensor-element.*

*18. The laser-radiation sensor of claim 17, wherein the sensor-element is a continuous layer of the oriented polycrystalline sensor-material extending between the first and second electrodes.*

*19. The laser-radiation sensor of claim 17, wherein the sensor-element includes a plurality of strips of the oriented polycrystalline sensor-material spaced apart, parallel to each other, and extending between the first and second electrodes.*

*20. The laser-radiation sensor of claim 19, wherein the strips of the sensor-element are aligned parallel to the crystalline c-axis of the oriented polycrystalline sensor-material.*

*21. The laser-radiation sensor of claim 17, further including a protection layer between the sensor-element and the radiation-absorber layer.*

*22. The laser- radiation sensor of claim 17, wherein the buffer layer is a layer of material selected from a group of materials consisting of magnesium oxide, yttrium stabilized zirconia, and cerium oxide.*

*23. The laser-radiation sensor of claim 17, wherein the first and second angles are about the same.*

*24. A laser-radiation sensor, comprising:*

*a copper substrate;*

*an oriented polycrystalline buffer-layer deposited over the substrate, the buffer-layer having a crystal-orientation at a first angle between about 10 degrees and about 45 degrees relative to a normal to the surface of the substrate;*

*an oriented polycrystalline sensor-element of a thermoelectric material selected from the group of thermoelectric materials consisting of dysprosium barium cuprate, strontium sodium cobaltate, and strontium cobaltate deposited over the buffer layer, the sensor-element having a crystalline c-axis orientation at a second angle between about 10 degrees and about 45 degrees relative to the normal to the surface of the substrate;*

*a radiation-absorber layer in thermal communication with the sensor-element; and*

*first and second elongated electrodes spaced apart in electrical contact with the sensor-element.*

*25. The laser-radiation sensor of claim 24, wherein the sensor-element is a continuous layer of the oriented polycrystalline sensor-material extending between the first and second electrodes.*

*26. The laser-radiation sensor of claim 24, wherein the sensor-element includes a plurality of strips of the oriented polycrystalline sensor-material spaced apart, parallel to each other, and extending between the first and second electrodes.*

*27. The laser-radiation sensor of claim 26, wherein the strips of the sensor-element are aligned parallel to the crystalline c-axis of the oriented polycrystalline sensor-material.*

*28. The laser-radiation sensor of claim 24, further including a protection layer between the sensor-element and the radiation-absorber layer.*

*29. The laser-radiation sensor of claim 24, wherein the buffer layer is a layer of material selected from a group of materials consisting of magnesium oxide, yttrium stabilized zirconia, and cerium oxide.*

*30. The laser-radiation sensor of claim 24, wherein the first and second angles are about the same.*

* * * * *